(12) United States Patent
Zhang (10) Patent No.: US 7,786,553 B1
(45) Date of Patent: Aug. 31, 2010

(54) METHOD OF FABRICATING SEMICONDUCTOR DEVICE

(75) Inventor: Hongyong Zhang, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/362,808

(22) Filed: Jul. 28, 1999

Related U.S. Application Data (62) Division of application No. 08/753,428, filed on Nov. 25, 1996, now Pat. No. 5,940,732.

(30) Foreign Application Priority Data

Nov. 27, 1995 (JP) .................................. 7-332629

(51) Int. Cl.
  *H01L 23/58* (2006.01)
  *H01L 31/00* (2006.01)
  *H01L 21/33* (2006.01)
  *H01L 21/4763* (2006.01)

(52) U.S. Cl. ........................ 257/640; 257/657; 257/658; 257/771; 438/368; 438/618; 438/620

(58) Field of Classification Search ................ 438/368, 438/618, 620, 622; 257/774, 640, 657, 658, 257/771; 252/632, 638, 640
See application file for complete search history.

(56) References Cited

U.S. PATENT DOCUMENTS

| | | | |
|---|---|---|---|
| 4,040,083 A | 8/1977 | Saiki et al. | |
| 4,103,297 A | 7/1978 | McGreivy et al. | |
| 4,334,349 A | 6/1982 | Aoyama et al. | |
| 4,342,617 A | 8/1982 | Fu et al. | |
| 4,365,264 A | 12/1982 | Mukai et al. | |
| 4,371,423 A | 2/1983 | Yoshizawa et al. | |
| 4,404,733 A | * 9/1983 | Sasaki | |
| 4,495,220 A | 1/1985 | Wolf et al. | |
| 4,814,041 A | 3/1989 | Auda | |
| 5,003,356 A | 3/1991 | Wakai et al. | |
| 5,032,883 A | 7/1991 | Wakai et al. | |
| 5,055,906 A | 10/1991 | Mase et al. | |
| 5,056,895 A | 10/1991 | Kahn | |

(Continued)

FOREIGN PATENT DOCUMENTS

EP        0 263 220        4/1988

(Continued)

OTHER PUBLICATIONS

"An Organic low dielectric constant film is going to be developed for 0.18-0.13 μm", Nikkei Microdevices, Nov. 1, 1995, pp. 140-141.

(Continued)

*Primary Examiner*—Long Pham
*Assistant Examiner*—Steven H Rao
(74) *Attorney, Agent, or Firm*—Fish & Richardson P.C.

(57) ABSTRACT

Method of fabricating thin-film transistors in which contact with connecting electrodes becomes reliable. When contact holes are formed, the bottom insulating layer is subjected to a wet etching process, thus producing undercuttings inside the contact holes. In order to remove the undercuttings, a light etching process is carried out to widen the contact holes. Thus, tapering section are obtained, and the covering of connection wiring is improved.

78 Claims, 6 Drawing Sheets

U.S. PATENT DOCUMENTS

| | | | |
|---|---|---|---|
| 5,084,905 A | 1/1992 | Sasaki et al. | |
| 5,117,278 A | 5/1992 | Bellersen et al. | 357/72 |
| 5,132,386 A | 7/1992 | Suzuki et al. | |
| 5,155,053 A | 10/1992 | Atkinson | |
| 5,200,846 A | 4/1993 | Hiroki et al. | |
| 5,231,054 A | 7/1993 | Kosugi | |
| 5,235,195 A | 8/1993 | Tran et al. | |
| 5,264,077 A | 11/1993 | Fukui et al. | |
| 5,264,731 A | 11/1993 | Tamura et al. | 257/791 |
| 5,287,205 A | 2/1994 | Yamazaki et al. | |
| 5,308,998 A | 5/1994 | Yamazaki et al. | |
| 5,320,981 A | 6/1994 | Blalock | |
| 5,327,001 A | 7/1994 | Wakai et al. | |
| 5,414,442 A | 5/1995 | Yamazaki et al. | 345/89 |
| 5,453,403 A | 9/1995 | Meng et al. | |
| 5,453,858 A | 9/1995 | Yamazaki | |
| 5,492,843 A | 2/1996 | Adachi et al. | |
| 5,495,353 A | 2/1996 | Yamazaki et al. | |
| 5,529,937 A | 6/1996 | Zhang et al. | |
| 5,550,405 A | 8/1996 | Cheung et al. | 257/642 |
| 5,552,343 A | 9/1996 | Hsu | |
| 5,568,288 A | 10/1996 | Yamazaki et al. | |
| 5,585,951 A | 12/1996 | Noda et al. | |
| 5,604,380 A | 2/1997 | Nishimura et al. | 257/758 |
| 5,612,799 A | 3/1997 | Yamazaki et al. | |
| 5,614,732 A | 3/1997 | Yamazaki | |
| 5,620,905 A | 4/1997 | Konuma et al. | |
| 5,620,910 A | 4/1997 | Teramoto | |
| 5,683,938 A | 11/1997 | Kim et al. | |
| 5,717,224 A | 2/1998 | Zhang | |
| 5,719,065 A | 2/1998 | Takemura et al. | |
| 5,721,601 A | 2/1998 | Yamaji et al. | |
| 5,753,952 A | 5/1998 | Mehrad | |
| 5,784,073 A | 7/1998 | Yamazaki et al. | |
| 5,837,619 A | 11/1998 | Adachi et al. | |
| 5,841,195 A * | 11/1998 | Lin et al. | 257/774 |
| 5,847,410 A | 12/1998 | Nakajima | |
| 5,849,611 A | 12/1998 | Yamazaki et al. | |
| 5,859,683 A | 1/1999 | Tagusa et al. | |
| 5,879,974 A | 3/1999 | Yamazaki | |
| 5,880,038 A | 3/1999 | Yamazaki et al. | |
| 5,905,555 A | 5/1999 | Yamazaki et al. | |
| 5,925,421 A | 7/1999 | Yamazaki et al. | |
| 5,933,205 A | 8/1999 | Yamazaki et al. | |
| 5,940,732 A | 8/1999 | Zhang | |
| 5,946,059 A | 8/1999 | Yamazaki et al. | |
| 5,946,065 A | 8/1999 | Tagusa et al. | |
| 5,952,708 A | 9/1999 | Yamazaki | |
| 5,953,084 A | 9/1999 | Shimada et al. | |
| 5,956,105 A | 9/1999 | Yamazaki et al. | |
| 5,963,278 A | 10/1999 | Yamazaki et al. | |
| 5,977,562 A | 11/1999 | Hirakata et al. | |
| 5,986,738 A | 11/1999 | Tagusa et al. | |
| 5,990,491 A | 11/1999 | Zhang | |
| 6,015,724 A | 1/2000 | Yamazaki | |
| 6,027,960 A | 2/2000 | Kusumoto et al. | |
| 6,051,453 A | 4/2000 | Takemura | |
| 6,052,162 A | 4/2000 | Shimada et al. | |
| 6,071,764 A | 6/2000 | Zhang et al. | |
| 6,077,758 A | 6/2000 | Zhang et al. | |
| 6,096,581 A * | 8/2000 | Zhang | 438/149 |
| 6,097,452 A | 8/2000 | Shimada et al. | |
| 6,147,375 A | 11/2000 | Yamazaki et al. | |
| 6,195,138 B1 | 2/2001 | Shimada et al. | |
| 6,204,907 B1 | 3/2001 | Hiraishi et al. | |
| 6,310,362 B1 | 10/2001 | Takemura | |
| 6,433,851 B2 | 8/2002 | Shimada et al. | |
| 6,455,401 B1 | 9/2002 | Zhang et al. | |
| 6,475,903 B1 | 11/2002 | Gardner | |
| 6,534,832 B2 | 3/2003 | Takemura | |
| 6,900,462 B2 | 5/2005 | Suzawa et al. | |
| 6,924,213 B2 | 8/2005 | Zhang et al. | |
| 6,936,847 B2 | 8/2005 | Tanabe et al. | |
| 7,056,775 B2 | 6/2006 | Zhang et al. | |
| 7,190,428 B2 | 3/2007 | Yamazaki | |
| 2003/0218215 A1 | 11/2003 | Takemura | |
| 2005/0287722 A1 | 12/2005 | Zhang | |
| 2006/0060861 A1 | 3/2006 | Yamazaki et al. | |
| 2006/0113541 A1 | 6/2006 | Takemura | |

FOREIGN PATENT DOCUMENTS

| | | | |
|---|---|---|---|
| EP | 0 603 866 | 6/1994 | |
| JP | 63-034928 | 2/1988 | |
| JP | 63-104338 | 5/1988 | |
| JP | 63-296353 | 12/1988 | |
| JP | 64-033971 | 2/1989 | |
| JP | 01-286443 | 11/1989 | |
| JP | 02-025024 | 1/1990 | |
| JP | 02-044769 | 2/1990 | |
| JP | 02-278749 | 11/1990 | |
| JP | 03-286524 | 12/1991 | |
| JP | 04-007858 | 1/1992 | |
| JP | 04-076915 | 3/1992 | |
| JP | 04-116954 | 4/1992 | |
| JP | 04-142740 | 5/1992 | |
| JP | 04-155834 | 5/1992 | |
| JP | 04-251926 | 9/1992 | |
| JP | 04-358129 | 12/1992 | |
| JP | 05-275373 | 10/1993 | |
| JP | 06-104281 | 4/1994 | |
| JP | 06-175156 | 6/1994 | |
| JP | 06-177155 | 6/1994 | |
| JP | 06-242433 | 9/1994 | |
| JP | 07-056190 | 3/1995 | |
| JP | 07-058107 | 3/1995 | |
| JP | 07-094757 | 4/1995 | |
| JP | 07-099324 | 4/1995 | |
| JP | 07-131034 | 5/1995 | |
| JP | 07-161816 | 6/1995 | |
| NL | 7 314 375 | 10/1972 | |
| NL | 7314375 | 10/1972 | 257/642 |
| NL | 7 314 375 | 4/1974 | |

OTHER PUBLICATIONS

Trial Decision (Japanese Application No. 2003-70819 ~ Laid Open on Oct. 10, 2003 as Patent Publication No. 2003-289081) dated Jan. 19, 2010 with English translation.

* cited by examiner

METHOD OF FABRICATING SEMICONDUCTOR DEVICE

This is a divisional of U.S. application Ser. No. 08/753,428, filed Nov. 25, 1996, now U.S. Pat. No. 5,940,732.

BACKGROUND OF THE INVENTION

1. Field of the Invention

The present invention relates to a method of fabricating a semiconductor device, using a crystalline thin-film semiconductor and, more particularly, to a method of fabricating planar type thin-film transistors.

2. Description of Related Art

In recent years, techniques for fabricating thin-film transistors (TFTs) on cheap glass substrates have evolved rapidly, because there is an increasing demand for active matrix liquid crystal displays.

An active matrix liquid crystal display has millions of pixels arranged in rows and columns. TFTs are arranged at these pixels. Electric charge going in and out of each electrode at the pixels is controlled by the switching action of the TFTs.

Therefore, if one TFT fails to operate, then pixel electrodes connected with the faulty TFT do not act as display elements. This gives rise to a so-called point defect. For example, in the case of a normally black liquid crystal display, when white color is displayed, the point defect appears as a black point, which is deeply harmful to the appearance. Furthermore, it has been required that a circuit (known as a peripheral driver circuit) for driving TFTs for displaying these pixel electrodes be formed out of TFTs integrated with the former TFTs on the same glass substrate.

In this case, if one driving TFT fails to operate, all TFTs applied with a driving voltage from the faulty TFT do not act as switching elements. This results in a so-called line defect. This is a fatal hindrance to the liquid crystal display.

Accordingly, in an active matrix liquid crystal display, millions of TFTs must operate normally and stably over a long term. However, the present situation is that it is difficult to eliminate point defects and line defects perfectly. One of the causes is poor contact. Poor contact is that an interconnect electrode is poorly electrically connected with an associated TFT at a contact location, thus a defective operation is occurred. Especially, in the case of a planar TFT, poor contact presents serious problems, because an interconnect electrode is electrically connected with an associated TFT through a thin contact hole.

The poor contact is a main cause of premature deterioration of semiconductor device characteristics. Especially, where large currents flow or the device is operated at high temperatures, the deterioration coursed by the poor contact is promoted. Therefore, it is said that the reliability of contacts determines the reliability of the semiconductor device.

Generally, in the case of pixel display regions of an active matrix liquid crystal display, the gate electrodes are brought out of the pixel display regions directly and so no contacts exist. That is, contact with the pixel electrodes is very important for the reliability of the liquid crystal display.

In the case of a peripheral driver circuit, very many (from tens of thousands to millions) contacts exist. Especially, because there exist gate electrode contacts, and because the temperature is elevated by large-current operation, the contacts must have higher reliability than the pixel display regions.

SUMMARY OF THE INVENTION

The causes of poor contact are classified into three major categories.

The first category is that a conductive film forming interconnect electrodes is not in ohmic contact with a semiconductor film forming the source/drain regions of TFTs. This is caused by formation of an insulating coating such as a metal oxide at the junction plane. Also, the states of the vicinities of the semiconductor film surface (doping concentration, defect level density, cleanliness, and so on) greatly affect the performance of the contacts.

The second category is that the conductive film forming the interconnect electrodes has poor coverage and thus the interconnect line breaks within a contact hole. In this case, it is necessary to improve the situation by the method of forming the interconnect electrodes or changing the film growth conditions better.

The third category is that an interconnect electrode breaks due to the cross-sectional shape of the contact hole. The cross-sectional shape of the contact hole depends heavily on the conditions under which the insulators (SiN, $SiO_2$, etc.) covered with the contact portions are etched.

In order to form contacts with good coverage, it is desired to have a continuously mildly changing cross-sectional shape, or a tapering shape. Overetch of the underlying films (wedge-shape recess) which is often encountered with insulating films between plural layers severely deteriorates the coverage.

It is an object of the present invention to provide a semiconductor device having contact holes through which interconnect electrodes are electrically connected with TFTs, the device being characterized in that the contact holes have improved cross-sectional shape, whereby reducing malfunctions of the TFTs which would normally be caused by poor contact.

It is a more specific object of the invention to provide a liquid crystal display having contacts of improved reliability, whereby the liquid crystal display has improved long-term reliability.

It is another object of the invention to provide a method of fabricating semiconductor devices with an improved yield by eliminating point defects and line defects.

One aspect of the invention lies in a method of fabricating a thin-film transistor comprising a gate region having a gate electrode made of a material capable of being anodized and source/drain regions made of a semiconductor. This method comprises the steps of: forming a multilayer insulating film comprises at least two layers which have a common constituent over said gate region and over said source/drain regions; and forming holes in said multilayer insulating film by dry etching techniques so as to form tapered sections having tilt angles which decrease successively from said top insulating layer toward said bottom insulating layer.

In one feature of the invention, the dry etch rates of the interlayer insulating films are controlled so as to form tapered sections. As a result, the tilt angles of the cross-sectional shape of the contact holes decrease successively from the top layer toward the bottom layer. The tilt angles of the bottom layer and the top layer are indicated by α and βB, respectively, in FIG. 3.

It is only necessary that the insulating films act only as interlayer insulating films and so they can be made from various materials such as silicon oxide, silicon nitride, and organic resins.

Preferably, the used material permits easy control of the dry etch rates, because desired taper can be readily accomplished by making the etch rate of the upper layer higher than that of the lower layer.

Generally, where contact holes are formed by dry etching techniques, reactive ion etching (RIE) is used. However, RIE has the disadvantage that if the instant (known as endpoint) at which the etching process ends is not clear, then a conductive thin film to which contact should be made is also etched away.

In the case of RIE, it is conventional to detect light emission due to a plasma in order to detect the endpoint. Specifically, certain radicals or ions produced during etching are monitored.

In this case, an interlayer insulating film consisting of silicon oxide which is formed on a gate-insulating film made of silicon oxide, for example, is etched. Light-emitting species to be monitored are mixed. This makes it difficult to confirm the endpoint.

Where the foregoing is taken into consideration, it is necessary that a insulating film used as an interlayer insulating film be selected, taking full account of the structure of the fabricated TFTs.

Another aspect of the invention lies in a method of fabricating a thin-film transistor comprising a gate region having a gate electrode made of a material capable of being anodized and source/drain regions made of a semiconductor. This method comprises the steps of: forming a thin film; forming a insulating film having a bottom surface over said gate region and over said source/drain regions such that said thin film is in contact with the bottom surface of said insulating film; forming holes in said insulating film by dry etching techniques; etching said thin film in contact with the bottom surface of said insulating film; and subjecting said holes to a light etching process.

In another feature of the invention, the contact holes are widened by the light etching process. Tapered section are formed around the tops of the contact holes.

If the thin film in contact with the bottom surface of the insulating film is etched by dry etching techniques, the insulating film is undercut because of isotropic etching. Hence, holes are formed. The undercutting will give rise to overetch, which in turn permits the interconnect electrodes to break later.

In the present invention, the light etching process can widen the contact holes by removing the undercutting inside the contact holes.

The light etching process is carried out with a higher $O_2$ content than during the step of forming the contact holes.

This eliminates overetch and, at the same time, causes resist mask for forming the contact holes to be recessed. The corners at the edges (the outer frames around the entrances to the contact holes) are rounded off.

That is, this light etching process results in contact holes having a cross-sectional shape which falls along a mild curve. Consequently, the coverage of the interconnect electrodes is quite good.

DETAILED DESCRIPTION OF THE EMBODIMENTS

Embodiment 1

A process sequence for fabricating TFTs in accordance with the present invention is illustrated in FIGS. 1(A)-1(D) and FIG. 2(A)-2(D).

Figure 1A:
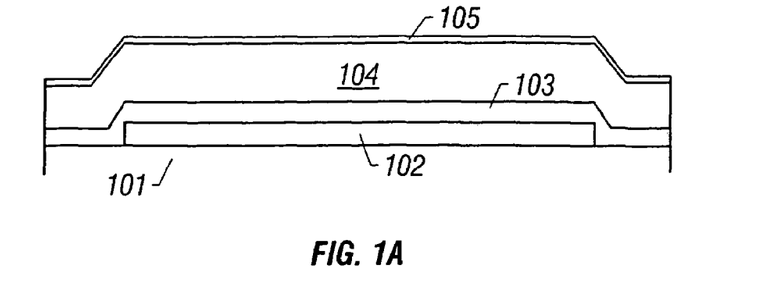
FIGS. 1(A)-1(D) and 2(A)-2(D) are cross-sectional views of a semiconductor device, illustrating a process sequence for fabricating the device by a method according to the present invention.

First, a glass substrate 101 having an insulating film such as a silicon oxide film on its surface is prepared. An amorphous silicon film (not shown) having a thickness of 500 Å is formed on the substrate by plasma CVD or LP thermal chemical vapor deposition. The amorphous film is crystallized by an appropriate crystallization method, which may be either heating or laser illumination.

Then, the crystalline silicon film obtained by crystallizing the amorphous silicon film is patterned into islands of a semiconductor layer 102 forming an active layer.

A silicon oxide film 103 which will act as a gate-insulating film later is formed on the semiconductor layer to a thickness of 1200 Å by plasma CVD or LP thermal chemical vapor deposition.

Then, a film 104 consisting only or mainly of aluminum is formed to a thickness of 4000 Å. This film 104 will act as a gate electrode later. Of course, other materials capable of being anodized such as tantalum and niobium may also be used.

Thereafter, anodization is carried out within an electrolytic solution, using the aluminum film 104 as an anode. The electrolytic solution is neutralizing 3% ethylene glycol solution of tartaric acid with aqueous ammonia and adjusting it to a pH of 6.92. Using a platinum cathode, the liquid is processed with an electric current of 5 mA. The voltage is increased up to 10 V.

A dense anodic oxide film 105 formed in this way acts to improve the adhesion to photoresist later. The thickness of the anodic oxide film 105 can be controlled by controlling the voltage application time (FIG. 1(A)).

Then the aluminum film 104 is patterned to formed a gate electrode (not shown).

Figure 1B:
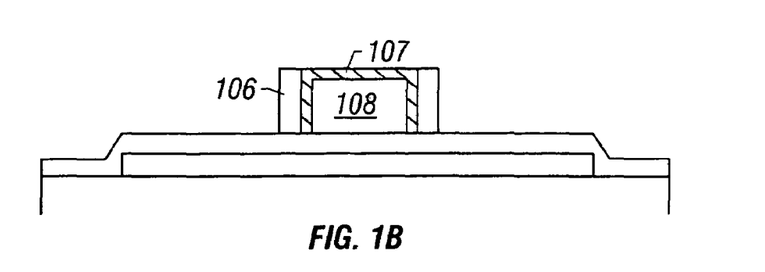

Then, a second anodic oxidation process is carried out to form a porous anodic oxide film 106. As an electrolytic solution, 3% aqueous solution of oxalic acid is used. A platinum cathode is employed. It is processed with an electric current of 2 to 3 mA. The voltage is increased up to 8 V.

At this time, the anodic oxidation progresses parallel to the substrate. The width of the porous anodic oxide film 106 can be controlled by the voltage application time.

After removing the photoresist with appropriate peeling liquid, a third anodic oxidation process is performed, thus obtaining a state shown in FIG. 1(B).

At this time, the electrolytic solution is neutralizing 3% ethylene glycol solution of tartaric acid with aqueous ammonia and adjusted to a pH of 6.92. Using a platinum cathode, the anodic oxidation is performed with an electric current of 5 to 6 mA. The voltage is increased up to 100 V.

The resulting anodic oxide film 107 is very dense and firm. Therefore, this protects the gate electrode 108 from damage in later steps such as implantation step.

The firm anodic oxide film 107 is not readily etched and so the etching time is prolonged when contact holes are formed. Therefore, it is desired to suppress the thickness of the film below 1000 Å.

Then, a dopant is implanted into the islands of semiconductor layer 102 by the ion implantation process. For example, when an N-channel TFT is manufactured, phosphorus (P) may be used as the dopant.

First, under the condition of FIG. 1(B), a first ion implantation process is carried out. Phosphorus (P) is implanted at an accelerating voltage of 60 to 90 kV at a dose of 0.2 to $5\times10^{15}$ atoms/cm$^2$. In the present example, the accelerating voltage is 80 kV, and the dose is $1\times10^{15}$ atoms/cm$^2$.

Using the gate electrode 108 and the porous anodic oxide film 106 as masks. Regions 109 and 110 which will become source/drain regions are formed by self-aligned technology.

Figure 1C:
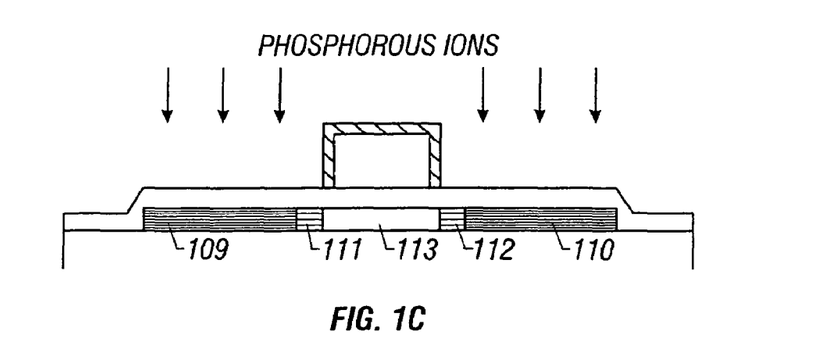

Then, as shown in FIG. 1(C), the porous anodic oxide film 106 is removed, and a second implantation process is performed. The second incorporation of phosphorus (P) is carried out at an accelerating voltage of 60 to 90 kV at a dose of 0.1 to $5\times10^{14}$ atoms/cm$^2$. In the present example, the accelerating voltage is 80 kV, and the dose is $1\times10^{14}$ atoms/cm$^2$.

The gate electrode 108 serves as a mask. Regions 111 and 112 more lightly doped than the source drain 109 and drain region 110 are formed by self-aligned technology.

At the same time, a region 113 acting as a channel for the TFT is formed by self-aligned technology, because no dopant is implanted at all right under the gate electrode 108.

The lightly doped drain (LDD) regions 112 formed in this way suppress generation of a high electric field between the channel region 113 and the drain region 110.

Then, irradiating with KrF excimer laser light and thermally annealing are performed. In the present example, the energy density of the laser light is 250 to 300 mJ/cm$^2$. The thermal annealing is carried out at 300 to 450° C. for 1 hour.

This step can heal the damage to the crystallinity of the islands of semiconductor layer 102 sustained by the ion implantation process.

Figure 1D:
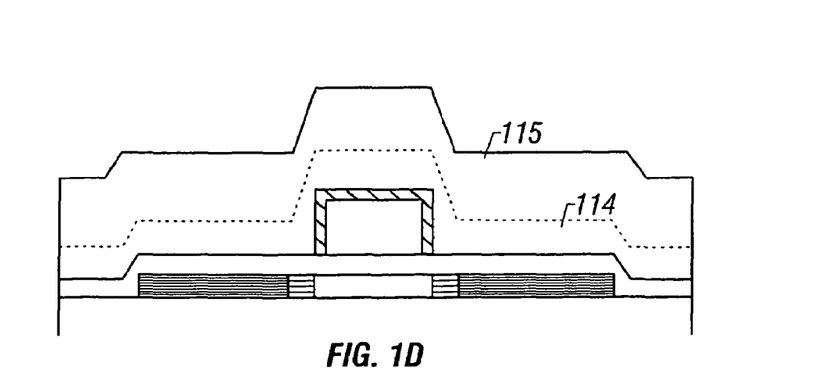

Then, as shown in FIG. 1(D), two interlayer insulating films 114 and 115 are formed by plasma CVD. In the present example, the interlayer insulating films 114 and 115 are made of silicon nitride films of different composition ratio.

At this time, the composition ratio of the silicon nitride film forming the second interlayer insulating film 115 gives a higher dry etch rate than that of the first interlayer insulating film 114. For example, the film of higher etch rate can be formed by increasing the pressure of the film-forming gas or the growth temperature or by lowering the RF power.

More specifically, where the first and second films are grown at 250° C. and 350° C., respectively, the dry etch rate of the second layer is approximately twice as high as the rate of the first layer.

The pressures of the gases for forming the first and second layers, respectively, are set to 0.3 and 0.7 torr, respectively. In this case, the dry etch rate of the second layer is about 1.5 times as high as the rate of the first layer.

Figure 3:
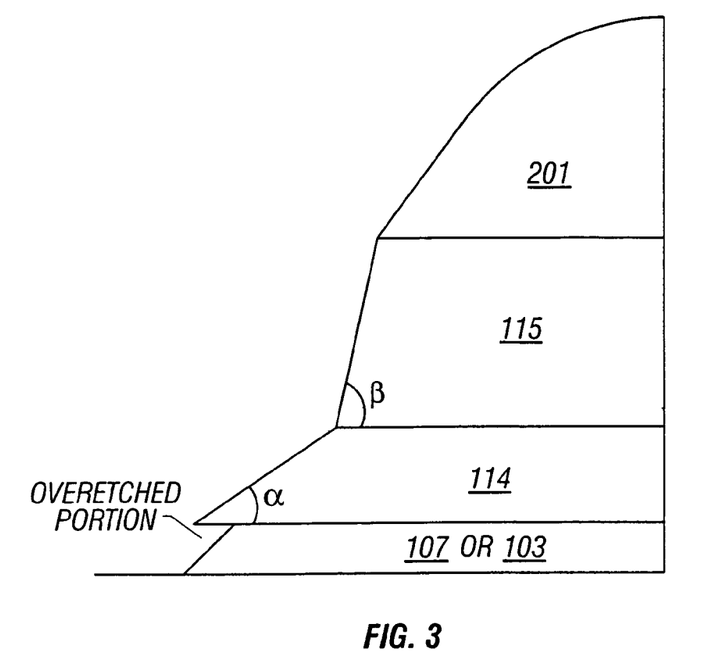
FIG. 3 is a cross-sectional view of a contact hole formed by the process sequence shown in FIGS. 1(A)-1(D) and 2(A)-2(B)

This is a requirement which must be satisfied in order that the tilt angle β of the second interlayer insulating film 115 be smaller than the tilt angle α of the first interlayer insulating film 114 in the shape of the contact hole shown in FIG. 3.

The total thickness of the first and second interlayer insulating films is 1 to 3 times as large as the thickness of the gate electrode 108 to improve the coverage of the interlayer insulating films. Thus, current leaking via the interlayer insulating films is prevented.

Preferably, the thickness of the first interlayer insulating film 114 is less than one third of the total thickness. If the thickness of the first interlayer insulating film is greater than this, the tilt angle α increases, thus resulting in difficulties in a light etching step carried out later.

Figure 2A:
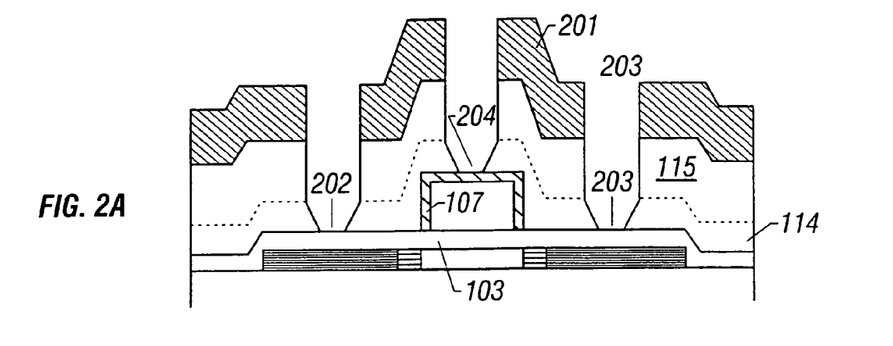

A resist mask indicated by 201 in FIG. 2(A) is formed, and a contact hole is formed by dry etching techniques. The composition of the etchant gas is so set that CF$_4$:O$_2$=40:60.

Figure 5:
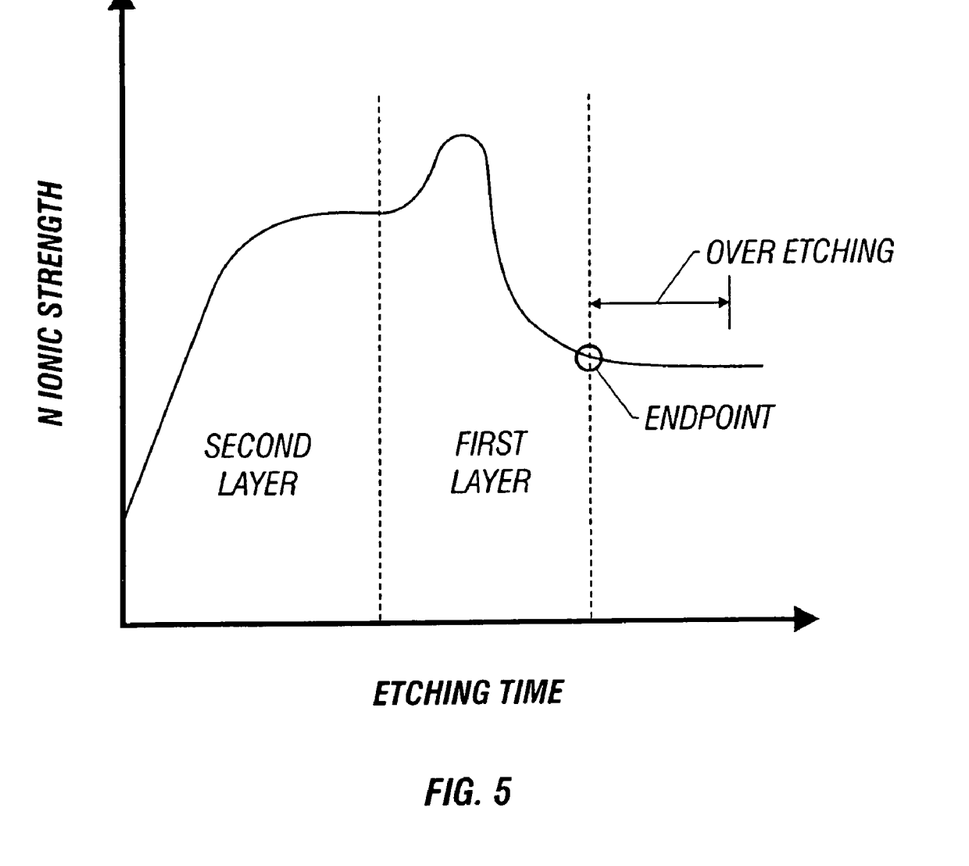
FIG. 5 is a graph illustrating the endpoint of a dry etching process.

The etching ends when a period of 150 seconds passes since the endpoint has been confirmed. The endpoint is detected as shown in FIG. 5. The signal intensity of nitrogen ions from the first layer is greater, because the first layer is denser than the second layer.

At this time, in the source/drain contact regions 202 and 203, the gate-insulating film 103 acts as a film that stops the dry etching process.

In the gate electrode region 204, the anodic oxide film 107 acts as a film that stops the dry etching process.

Since the second interlayer insulating film 115 is higher in etch rate than the first interlayer insulating film 114, tapered sections are formed as shown in FIG. 2(A).

Figure 2B:
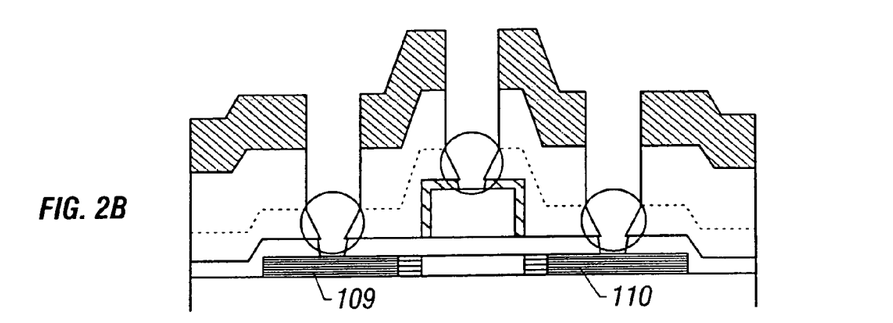

Then, the gate-insulating film 103 at the bottom surface of the contact hole is etched with buffeted hydrofluoric acid, thus completing the contact holes in the source/drain regions.

Thereafter, chromium mixed acid solution consisting of mixture of chromic acid, acetic acid, phosphoric acid, and nitric acid is used to etch the anodic oxide film 107, thus completing the contact hole in the gate electrode region.

Where the gate-insulating film 103 is etched first in this way, the gate electrode 108 can be protected, since the anodic oxide film 107 has excellent resistance to buffered hydrofluoric acid. The chromium mixed acid solution hardly attacks the source region 109 or drain region 110.

In this way, the state shown in FIG. 2(B) is obtained. Wet etching using buffered hydrofluoric acid or chromium mixed acid progresses isotropically and so overetched portions as shown in the circles of FIG. 2(B) are formed.

Figure 2C:
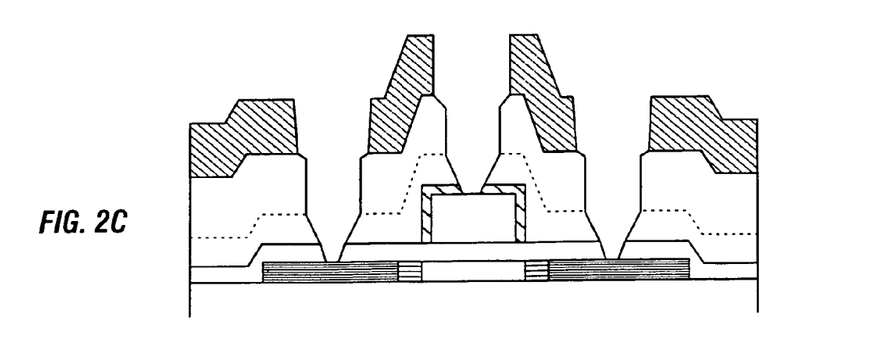

The interlayer insulating films are recessed by light etching, thus eliminating overetched portions, as shown in FIG. 2(C). At this time, as the tilt angle α of the first interlayer insulating film 114 decreases, the film can be more easily recessed.

This light etching process is carried out by dry etching techniques. The composition of the etchant gas is so set that CF$_4$:O$_2$=25:75. With this composition, the selectivity of silicon nitride with respect to silicon is more than 10. Hence, the surfaces of the source region 109 and drain region 110 are hardly etched.

Figure 4:
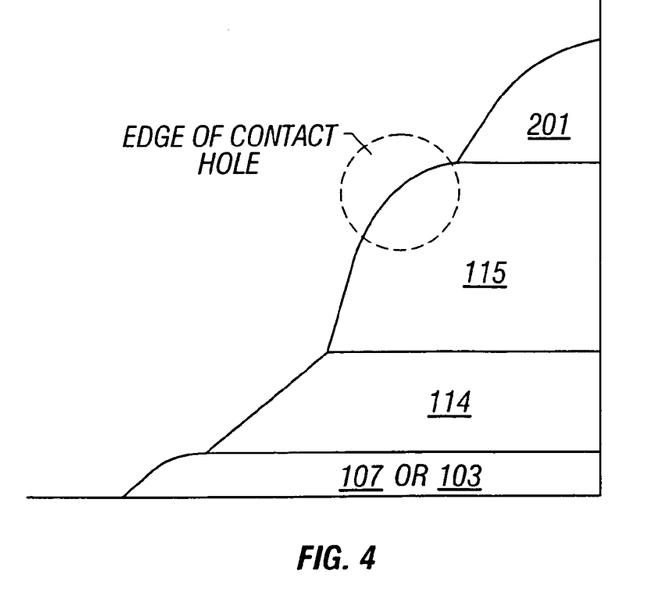
FIG. 4 is a cross-sectional view of a contact hole as shown in FIG. 2 (C) in which corners have been rounded off by a method according to the present invention.

This light etching is carried out by the gas with a high O$_2$ content. Therefore, the resist mask 201 is recessed simultaneously. Consequently, the corners of the cross-sectional shape at the edges of the contact hole are etched away and rounded off, as shown in the circle of FIG. 4.

Figure 2D:
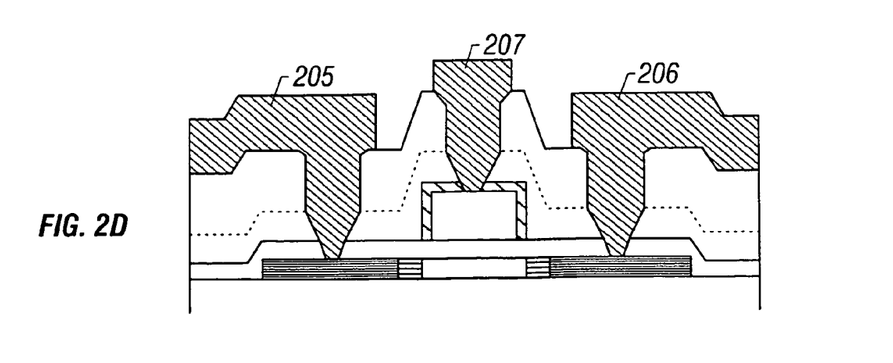

After the completion of the contact hole, interconnect electrodes 205, 206, and 207 are formed. Then annealing is performed in hydrogen ambient at 350° C. for 2 hours.

A thin-film transistor as shown in FIG. 2(D) is fabricated by performing the steps described above.

Embodiment 2

The present example is an example of application of the present invention to an IC fabrication process using single-crystal silicon wafer. More specifically, this is an example of fabrication of a MOS transistor, using the silicon wafer.

Figure 6A:
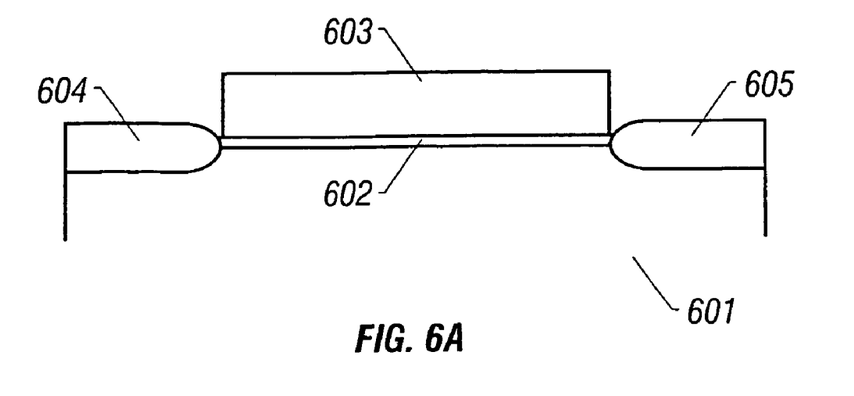
FIGS. 6(A)-6(C), 7(A)-7(B), and 8(A)-8(B) are cross-sectional views illustrating IC fabrication processes according to the invention.

The process sequence of the present invention is shown in FIGS. 6(A)-6(C), 7(A)-7(B), and 8(A)-8(B). First, as shown in FIG. 6(A), a thermal oxide film and a silicon nitride film are laminated over an N-type single-crystal silicon wafer 601 and patterned to create a patterned lamination of the thermal oxide film 602 and silicon nitride film 603.

Then, field oxide films 604 and 605 are formed by a selective thermal oxidization method. Thus, a state shown in FIG. 6(A) is obtained.

Then, the thermal oxide film 602 and the silicon nitride film 603 are removed. A thermal oxide film 606 is formed again by thermal oxidation. This thermal oxide film 606 forms a gate-insulating film.

Figure 6B:
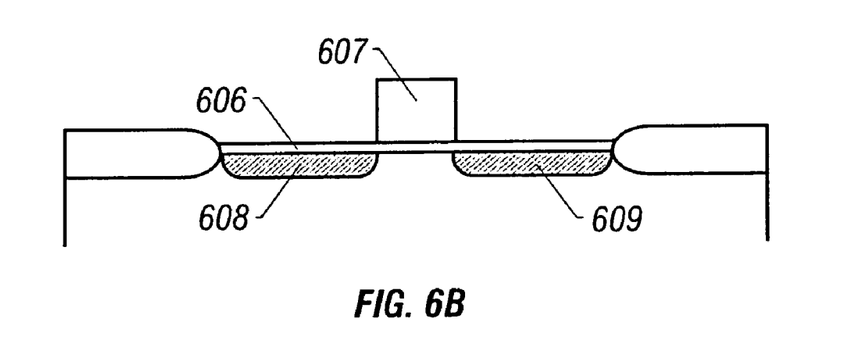

Thereafter, a gate electrode 607 is fabricated from an appropriate metal material, silicide material, or semiconductor material.

Subsequently, dopants are implanted to form source/drain regions.

In this example, boron (B) ions are introduced through ion implantation to fabricate a P-channel MOS transistor. If an N-channel MOS transistor is fabricated, phosphorus (P) ions may be introduced.

After the ion implantation described above, a heat-treatment is made to activate the introduced dopants and to anneal out damage to the semiconductor layer caused by the ion implantation.

In this way, a P-type source region 608 and a drain region 609 are formed by self-aligned technology, as shown in FIG. 6(B).

Figure 6C:
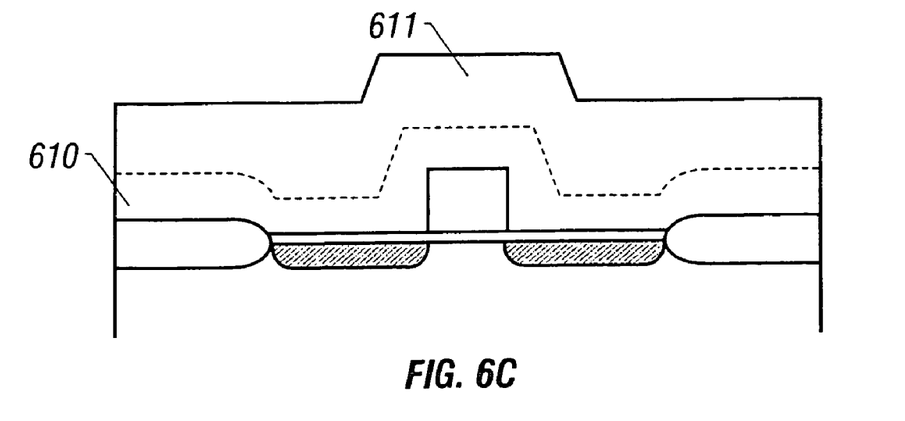

Then, silicon nitride films 610 and 611 are formed as interlayer insulating films. In the same way as in Example 1, the silicon nitride films 610 and 611 have such film properties that the film 611 has a higher etch rate than the below film 610.

Figure 7A:
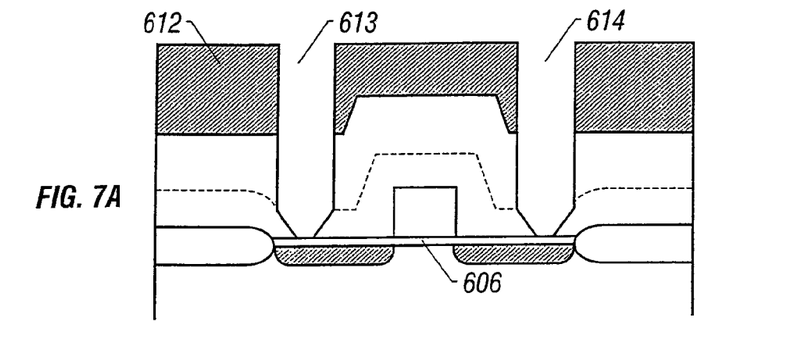

A state shown in FIG. 6(C) is obtained in this manner. Then, as shown in FIG. 7(A), a resist mask 612 is placed. Contact holes 613 and 614 are formed by dry etching techniques.

A state shown in FIG. 7(A) is obtained in this way. At this time, the gate-insulating film 606 consisting of a thermal oxide film acts as an etch stopper.

Figure 7B:
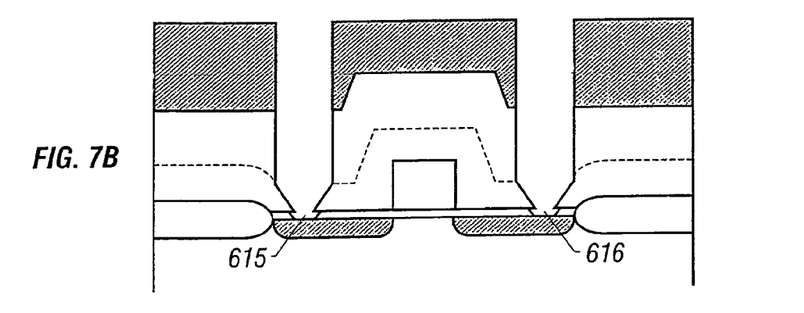

Contact holes 615 and 616 are then formed by wet etching techniques.

In this manner, a state shown in FIG. 7(B) is obtained. At this time, wet etching proceeds isotropically and so the contact holes 615 and 616 widen the bottoms of the contact holes 613 and 614, respectively.

Then, the interlayer insulating films and resist mask are recessed by light dry etching, using mixture of $CF_4$ and $O_2$. The oxygen is added, because the resist mask should be recessed.

Figure 8A:
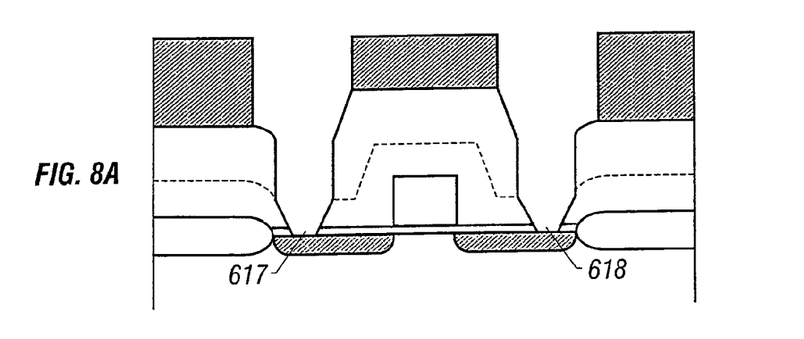
Figure 8B:
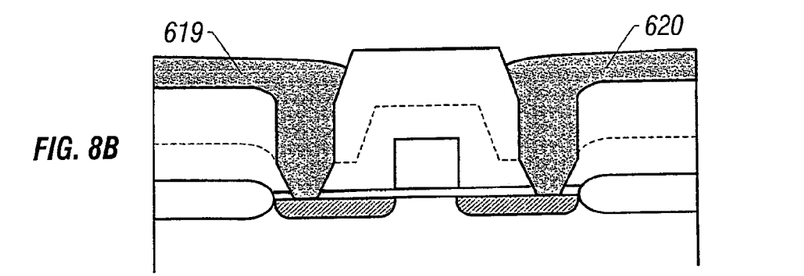

In this way, contacts having a mild cross-sectional shape as shown in FIG. 8(A) can be obtained. After obtaining the state shown in FIG. 8(A), a source electrode 619 and a drain electrode 620 are formed as shown in FIG. 8(B), thus completing a MOS transistor.

In the present invention, the interlayer insulating film is made of a multilayer structure consisting of two or more layers. The etch rate of an upper layer is made higher than that of a lower layer. Therefore, tapered section can be formed in such a way that the tilt angle decreases successively from the top layer of the interlayer insulating film toward the bottom layer.

Furthermore, undercutting of the gate-insulating film 103 and of the anodic oxide film 107 as shown in the circles of FIG. 2(B) can be prevented. In addition, the cross-sectional shape around the top of each contact hole can be improved as shown in FIGS. 2(C) and 3.

The cross-sectional shape of the contact hole can be improved greatly by the effects described above. The yield at which TFTs are fabricated and the reliability of interconnect contacts are enhanced. Concomitantly, the long-term reliability of the devices and display system can be enhanced.

What is claimed is:

1. A semiconductor device comprising:
a semiconductor having at least channel, source and drain regions;
an insulating film formed on said semiconductor;
a gate electrode over the insulating film;
a first interlayer insulating film over said insulating film and the gate electrode;
a second interlayer insulating film on said first interlayer insulating film, said second interlayer insulating film comprising a different material from said insulating film;
a first opening in said insulating film for exposing a portion of said semiconductor;
a second opening in said first interlayer insulating film for exposing said portion of said semiconductor layer and a portion of said insulating film that surrounds said first opening; and
a third opening in said second interlayer insulating film for exposing said portion of said semiconductor, said portion of said insulating film and a portion of said first interlayer insulating film that surrounds said second opening,
wherein edges of at least said third opening are rounded off, and
wherein a thickness of the first interlayer insulating film is less than one third of a total thickness of the first and second interlayer insulating films.

2. A device according to claim 1 wherein a taper angle β of the second interlayer insulating film with respect to a major surface of said semiconductor in the third opening is larger than a taper angle α of the first interlayer insulating film with respect to the major surface of said semiconductor in the second opening.

3. A device according to claim 1, wherein said insulating film comprises silicon oxide.

4. A device according to claim 1, wherein said first and second interlayer insulating films comprise a material selected from the group consisting of silicon nitride and organic resin.

5. A device according to claim 1, wherein said second interlayer insulating film has a dry etching rate higher than said first interlayer insulating film.

6. A semiconductor device comprising:
a semiconductor layer formed over a substrate having an insulating surface, said semiconductor layer having at least channel, source and drain regions;
a gate insulating film over said semiconductor layer;
a gate electrode over the gate insulating film;
a first interlayer insulating film over said gate insulating layer and the gate electrode
a second interlayer insulating film on said first interlayer insulating film, said second interlayer insulating film comprising a different material from said gate insulating film;
a first opening in said gate insulating film for exposing a portion of said semiconductor layer;

a second opening in said first interlayer insulating film for exposing said portion of said semiconductor layer and a portion of said gate insulating film that surrounds said first opening; and a third opening in said second interlayer insulating film for exposing said portion of said semiconductor layer, said portion of said gate insulating film and a portion of said first interlayer insulating film that surrounds said second opening, wherein edges of at least said third opening are rounded off, and wherein a taper angle β of the second interlayer insulating film with respect to a major surface of said semiconductor layer in the third opening is larger than a taper angle α of the first interlayer insulating film with respect to the major surface of said semiconductor layer in the second opening.

7. A device according to claim 6, wherein said gate insulating film comprises silicon oxide.

8. A device according to claim 6, wherein said first and second interlayer insulating film comprise a material selected from the group consisting of silicon nitride and organic resin.

9. A device according to claim 6, wherein said second interlayer insulating film has a dry etching rate higher than said first interlayer insulating film.

10. A semiconductor device comprising:
a semiconductor having at least channel, source and drain regions;
an insulating film on said semiconductor;
a gate electrode over the insulating film;
a first interlayer insulating film over said insulating film and the gate electrode;
a second interlayer insulating film on said first interlayer insulating film;
a first opening in said insulating film for exposing a portion of said semiconductor;
a second opening in said first interlayer insulating film for exposing said portion of said semiconductor and a portion of said insulating film that surrounds said first opening;
a third opening in said second interlayer insulating film for exposing said portion of said semiconductor, said portion of said insulating film and a portion of said first interlayer insulating film that surrounds said second opening; and
an electrode formed on said first, second, and third openings and connected with one of said source and drain regions through said first, second, and third openings,
wherein a taper angle β of the second interlayer insulating film with respect to a major surface of said semiconductor in the third opening is larger than a taper angle α of the first interlayer insulating film with respect to a major surface of said semiconductor in the second opening, and
wherein a thickness of the first interlayer insulating film is less than one third of a total thickness of the first and second interlayer insulating films.

11. A device according to claim 10, wherein said insulating film comprises silicon oxide.

12. A device according to claim 10, wherein said first and second interlayer insulating film comprise a material selected from the group consisting of silicon nitride and organic resin.

13. A device according to claim 10, wherein said second interlayer insulating film has a dry etching rate higher than said first interlayer insulating film.

14. A semiconductor device comprising:
a semiconductor layer formed over a substrate having an insulating surface and including at least channel, source and drain regions;
an insulating film on said semiconductor layer;
a gate electrode over the insulating film;
at least a first interlayer insulating film over the insulating film and over the gate electrode, and a second interlayer insulating film over the first interlayer insulating film;
at least one contact hole in said first and second interlayer insulating films and said insulating film, said contact hole having a tapered section; and
an electrode formed on said contact hole and connected with one of said source and drain regions through said contact hole,
wherein a taper angle β of an inner surface of the second interlayer insulating film in the contact hole with respect to a major surface of said semiconductor layer is larger than a taper angle α of an inner surface of the first interlayer insulating film in the contact hole with respect to said major surface of said semiconductor layer.

15. A device according to claim 14, wherein said insulating film comprises silicon oxide.

16. A device according to claim 14, wherein said first and second interlayer insulating film comprise a material selected from the group consisting of silicon nitride and organic resin.

17. A device according to claim 14, wherein said second interlayer insulating films has a dry etching rate higher than said first interlayer insulating layer.

18. A device according to claim 14, wherein angles of the tapered section of the contact hole decrease successively from the second interlayer insulating layer toward a first interlayer insulating layer.

19. A semiconductor device comprising:
a semiconductor having a channel region, at least one low doped impurity region, and at least one high doped impurity region said high doped impurity region being adjacent to said channel region with said low doped impurity region interposed therebetween;
an insulating film on said semiconductor;
a gate electrode over the insulating film;
at least a first interlayer insulating film over the insulating film and over the gate electrode, and a second interlayer insulating film over the first interlayer insulating film; and
a contact hole in said first and second interlayer insulating films and said insulating film for exposing a portion of said high doped impurity region, said contact hole including a first hole in the second interlayer insulating film, a second hole in the first interlayer insulating film, and a third hole in the insulating film, the contact hole having a tapered section such that the first hole has a larger cross section than the second hole, and the second hole has a larger cross section than the third hole,
wherein edges of said second interlayer insulating film in said contact hole are rounded off,
wherein angles of the tapered section of the contact hole decrease successively from the second interlayer insulating film toward the first interlayer insulating film, and
wherein a thickness of the first interlayer insulating film is less than one third of a total thickness of the first and second interlayer insulating films.

20. A device according to claim 19 wherein said insulating film comprises silicon oxide.

21. A device according to claim 19 wherein at least one of said first and second interlayer insulating films comprises a material selected from the group consisting of silicon nitride and organic resin.

22. A device according to claim 19 wherein said low doped impurity region includes phosphorus at a dose of 0.1 to $5 \times 10^{14}$ atoms/cm$^2$.

23. A device according to claim 19 wherein said high doped impurity region includes phosphorus at a dose of 0.2 to $5 \times 10^{15}$ atoms/cm$^2$.

24. A semiconductor device comprising:
a semiconductor layer formed over a substrate having an insulating surface and having a channel region, at least one low doped impurity region, and at least one high doped impurity region said high doped impurity region being adjacent to said channel region with said low doped impurity region interposed therebetween;
an insulating film on said semiconductor layer;
a gate electrode over the insulating film;
at least a first interlayer insulating film over the insulating film and over the gate electrode, and a second interlayer insulating film over the first interlayer insulating film;
a contact hole in said interlayer insulating films and said insulating film for exposing a portion of said high doped impurity region, said contact hole has a tapered section; and
an electrode formed on said contact hole and connected with one of said source and drain regions through said contact hole,
wherein edges of said interlayer insulating film in said contact hole are rounded off.

25. A device according to claim 24, wherein a taper angle β of an inner surface of the second interlayer insulating film in the contact hole with respect to a major surface of said semiconductor layer is larger than a taper angle α of an inner surface of first interlayer insulating film in the contact hole with respect to said major surface of said semiconductor layer.

26. A device according to claim 24, wherein angles of the taper shape of the contact hole decrease successively from the second interlayer insulating film toward the first interlayer insulating film.

27. A device according to claim 24 wherein said insulating film comprises silicon oxide.

28. A device according to claim 19 wherein at least one of said first and second interlayer insulating films comprises a material selected from the group consisting of silicon nitride and organic resin.

29. A device according to claim 24 wherein said low doped impurity region includes phosphorus at a dose of 0.1 to $5 \times 10^{14}$ atoms/cm$^2$.

30. A device according to claim 24 wherein said high doped impurity region includes phosphorus at a dose of 0.2 to $5 \times 10^{15}$ atoms/cm$^2$.

31. A device according to claim 1, wherein edges of said first opening are rounded off.

32. A device according to claim 1, further comprising an electrode connected with one of said source and drain regions through said first, second, and third openings.

33. A device according to claim 6, wherein edges of said first opening are rounded off.

34. A device according to claim 6, further comprising an electrode connected with one of said source and drain regions through said first, second, and third openings.

35. A device according to claim 19, wherein edges of said insulating film in said contact hole are rounded off.

36. A device according to claim 19, further comprising an electrode connected with one of said source and drain regions through said contact hole.

37. A device according to claim 24, wherein edges of said insulating film in said contact hole are rounded off.

38. A device according to claim 6, wherein a thickness of the first interlayer insulating film is less than one third of a total thickness of the first and second interlayer insulating films.

39. A device according to claim 14, wherein a thickness of the first interlayer insulating film is less than one third of a total thickness of the first and second interlayer insulating films.

40. A device according to claim 24, wherein a thickness of the first interlayer insulating film is less than one third of a total thickness of the first and second interlayer insulating films.

41. A device according to claim 14, wherein said first interlayer insulating film is formed on and in contact with the insulating film, and over the gate electrode, and said second interlayer insulating film is formed on and in contact with said first interlayer insulating film.

42. A device according to claim 19, wherein said first interlayer insulating film is formed on and in contact with the insulating film, and over the gate electrode, and said second interlayer insulating film is formed on and in contact with said first interlayer insulating film.

43. A device according to claim 24, wherein said first interlayer insulating film is formed on and in contact with the insulating film, and over the gate electrode, and said second interlayer insulating film is formed on and in contact with said first interlayer insulating film.

44. A semiconductor device comprising:
a metal layer formed over a glass substrate;
a first insulating film over the metal layer;
a second insulating film over the first insulating film;
a first opening in the first insulating film to expose a portion of the metal layer; and
a second opening in the second insulating film to expose a portion of the metal layer and a portion of the first insulating film,
wherein a first taper angle of the first insulating film in the first opening is smaller than a second taper angle of the second insulating film in the second opening.

45. The semiconductor device according to claim 44, wherein said first insulating film and said second insulating film are formed from a same material.

46. The semiconductor device according to claim 44, wherein at least any one of said first insulating film and said second insulating film are formed from silicon nitride.

47. A semiconductor device comprising:
a metal layer formed over a glass substrate;
a first insulating film over the metal layer;
a second insulating film over the first insulating film;
a first opening in the first insulating film to expose a portion of the metal layer; and
a second opening in the second insulating film to expose a portion of the metal layer and a portion of the first insulating film,
wherein a thickness of the first insulating film is less than one third of a total thickness of the first and second insulating films, and
wherein a first taper angle of the first insulating film in the first opening is smaller than a second taper angle of the second insulating film in the second opening.

48. The semiconductor device according to claim 47, wherein said first insulating film and said second insulating film are formed from a same material.

49. The semiconductor device according to claim 47, wherein at least any one of said first insulating film and said second insulating film are formed from silicon nitride.

50. A semiconductor device comprising:
a substrate having an insulating surface;
at least one thin film transistor formed over the substrate, the thin film transistor comprising a source region, a drain region, a channel formation region provided between the source region and the drain region, and a gate electrode provided adjacent to the channel formation region with a gate insulating film therebetween;
a multilayer insulating film provided over the thin film transistor and comprising at least two layers including a first insulating layer and a second insulating layer over the first insulating layer and comprising a different material from the first insulating layer;
a contact hole provided through the multilayer insulating film, the contact hole including a first opening through the first insulating layer and a second opening through the second insulating layer and concentric with the first opening; and
a wiring provided over the multilayer insulating film and electrically connected to one of the source region and the drain region through the contact hole,
wherein:
an edge of the second opening is rounded off;
a side surface of the multilayer insulating film in the contact hole is tapered such that the second opening exposes a portion of the first insulating film that surrounds the first opening; and
a thickness of the first insulating layer is less than one third of a total thickness of the multilayer insulating film.

51. A semiconductor device comprising:
a substrate having an insulating surface;
at least one thin film transistor formed over the substrate, the thin film transistor comprising a source region, a drain region, a channel formation region provided between the source region and the drain region, and a gate electrode provided adjacent to the channel formation region with a gate insulating film therebetween;
a multilayer insulating film provided over the thin film transistor and comprising at least two layers including a first insulating layer and a second insulating layer over the first insulating layer;
a contact hole provided through the multilayer insulating film, the contact hole including a first opening through the first insulating layer and a second opening through the second insulating layer and concentric with the first opening;
a pixel electrode provided over the multilayer insulating film and electrically connected to one of the source region and the drain region through the contact hole,
wherein:
an edge of the second opening is rounded off;
a side surface of the multilayer insulating film in the contact hole is tapered;
a thickness of the first insulating layer is less than one third of a total thickness of the multilayer insulating film; and
a side surface of the first insulating layer in the contact hole has a first taper angle and a side surface of the second insulating layer in the contact hole has a second taper angle, and the first taper angle and the second taper angle are different angles.

52. A semiconductor device comprising:
a substrate having an insulating surface;
at least one thin film transistor formed over the substrate, the thin film transistor comprising a source region, a drain region, a channel formation region provided between the source region and the drain region, and a gate electrode provided adjacent to the channel formation region with a gate insulating film therebetween;
a multilayer insulating film provided over the thin film transistor and comprising at least two layers including a first insulating layer and a second insulating layer over the first insulating layer;
a contact hole provided through the multilayer insulating film, the contact hole including a first opening through the first insulating layer and a second opening through the second insulating layer and concentric with the first opening;
a wiring provided over the multilayer insulating film and electrically connected to one of the source region and the drain region through the contact hole,
wherein:
an edge of the second opening is rounded off;
a diameter of contact hole is larger at a lowermost surface of the second insulating layer than at a lowermost surface of the first insulating layer;
a thickness of the first insulating layer is less than one third of a total thickness of the multilayer insulating film; and
a side surface of the first insulating layer in the contact hole has a first taper angle and a side surface of the second insulating layer in the contact hole has a second taper angle, and the first taper angle and the second taper angle are different angles.

53. A semiconductor device comprising:
a substrate;
an underlying insulating film formed over the substrate;
at least one thin film transistor formed over the substrate and the underlying insulating film, the thin film transistor comprising a source region, a drain region, a channel formation region provided between the source region and the drain region, and a gate electrode provided adjacent to the channel formation region with a gate insulating film therebetween;
a multilayer insulating film provided over the thin film transistor and comprising at least two layers including a first insulating layer and a second insulating layer over the first insulating layer;
a contact hole provided through the multilayer insulating film, the contact hole including a first opening through the first insulating layer and a second opening through the second insulating layer and concentric with the first opening;
a wiring provided over the multilayer insulating film and electrically connected to one of the source region and the drain region through the contact hole,
wherein:
an edge of the second opening is rounded off;
a side surface of the multilayer insulating film in the contact hole is tapered; and
a thickness of the first insulating layer is less than one third of a total thickness of the multilayer insulating film.

54. A semiconductor device comprising:
a substrate;
an underlying insulating film formed over the substrate;
at least one thin film transistor formed over the substrate and the underlying insulating film, the thin film transistor comprising a source region, a drain region, a channel formation region provided between the source region and the drain region, and a gate electrode provided adjacent to the channel formation region with a gate insulating film therebetween;

a multilayer insulating film provided over the thin film transistor and comprising at least two layers including a first insulating layer and a second insulating layer over the first insulating layer;

a contact hole provided through the multilayer insulating film, the contact hole including a first opening through the first insulating layer and a second opening through the second insulating layer and concentric with the first opening;

a pixel electrode provided over the multilayer insulating film and electrically connected to one of the source region and the drain region through the contact hole, wherein:

an edge of the second opening is rounded off;

a diameter of contact hole is larger at a lowermost surface of the second insulating layer than at a lowermost surface of the first insulating layer;

a thickness of the first insulating layer is less than one third of a total thickness of the multilayer insulating film; and a side surface of the first insulating layer in the contact hole has a first taper angle and a side surface of the second insulating layer in the contact hole has a second taper angle, and the first taper angle and the second taper angle are different angles.

55. The semiconductor device of claim 50, wherein the first insulating layer is made of silicon nitride.

56. The semiconductor device of claim 51, wherein the first insulating layer is made of silicon nitride.

57. The semiconductor device of claim 52, wherein the first insulating layer is made of silicon nitride.

58. The semiconductor device of claim 53, wherein the first insulating layer is made of silicon nitride.

59. The semiconductor device of claim 54, wherein the first insulating layer is made of silicon nitride.

60. The semiconductor device of claim 51, wherein the first taper angle is smaller than the second taper angle.

61. The semiconductor device of claim 52, wherein the first taper angle is smaller than the second taper angle.

62. The semiconductor device of claim 53, wherein the underlying insulating film comprises one of silicon oxide and silicon nitride.

63. The semiconductor device of claim 54, wherein the underlying insulating film comprises one of silicon oxide and silicon nitride.

64. The semiconductor device of claim 50, wherein the semiconductor device comprises an active matrix liquid crystal display.

65. The semiconductor device of claim 51, wherein the semiconductor device comprises an active matrix liquid crystal display.

66. The semiconductor device of claim 52, wherein the semiconductor device comprises an active matrix liquid crystal display.

67. The semiconductor device of claim 53, wherein the semiconductor device comprises an active matrix liquid crystal display.

68. The semiconductor device of claim 54, wherein the semiconductor device comprises an active matrix liquid crystal display.

69. A semiconductor display device comprising:

a semiconductor having at least channel, source and drain regions, with the source and drain regions being arranged on opposite sides of the channel region;

an insulating film over said semiconductor over the source and drain regions, the insulating film comprising a lower portion formed on the semiconductor and an upper portion over the lower portion; and an opening in said insulating film for exposing a portion of said semiconductor, the opening including a first portion through the lower portion of the insulating film and a second portion through the upper portion of the insulating film;

wherein a first taper angle of the upper portion of the insulating film with respect to a major surface of said semiconductor in the second portion of the opening is larger than a second taper angle of the lower portion of the insulating film with respect to the major surface of said semiconductor in the first portion of the opening, and wherein a thickness of the lower portion of the insulating film is less than one third of a total thickness of the insulating film.

70. The semiconductor display device of claim 69, wherein the insulating film comprise a material selected from the group consisting of silicon nitride and organic resin.

71. The semiconductor display device of claim 69, wherein:

the device comprises multiple openings in the insulating film for exposing portions of the semiconductor, each of the openings including a first portion through the lower portion of the insulating film and a second portion through the upper portion of the insulating film; and for each opening, a first taper angle of the upper portion of the insulating film with respect to a major surface of the semiconductor in the second portion of the opening is larger than a second taper angle of the lower portion of the insulating film with respect to the major surface of the semiconductor in the first portion of the opening.

72. The semiconductor display device of claim 69, wherein one of the opening exposes the source region and another one of the openings exposes the drain region.

73. The semiconductor display device of claim 69, further comprising an electrode formed so as to connected with one of the source and drain regions through the opening.

74. The semiconductor display device of claim 69, wherein the insulating film comprises a first insulating film that defines the lower portion of the insulating film and a second insulating film that defines the upper portion of the insulating film.

75. The semiconductor display device of claim 74, further comprising a gate electrode formed between the first insulating film and the second insulating film.

76. The semiconductor display device of claim 69, wherein the opening exposes one of the source and drain regions.

77. A method for fabricating a semiconductor device, the method comprising:

forming a semiconductor film on an insulating surface;

forming an insulating film over the semiconductor film, the insulating film comprising a lower portion formed on the semiconductor film and an upper portion over the lower portion; and forming an opening in the insulating film for exposing a portion of the semiconductor film, the opening including a first portion through the lower portion of the insulating film and a second portion through the upper portion of the insulating film;

wherein a first taper angle of the upper portion of the insulating film with respect to a major surface of said semiconductor film in the second portion of the opening is larger than a second taper angle of the lower portion of the insulating film with respect to the major surface of the semiconductor film in the first portion of the opening, and wherein a thickness of the lower portion of the insulating film is less than one third of a total thickness of the insulating film.

78. The method for fabricating a semiconductor device according to claim 77, wherein:
   forming the semiconductor film further comprises processing the semiconductor film to include at least channel, source and drain regions, with the source and drain regions being arranged on opposite sides of the channel region, and
   forming the opening comprises forming the opening to expose the source or drain region.

* * * * *

UNITED STATES PATENT AND TRADEMARK OFFICE
CERTIFICATE OF CORRECTION

PATENT NO.         : 7,786,553 B1                                   Page 1 of 1
APPLICATION NO.    : 09/362808
DATED              : August 31, 2010
INVENTOR(S)        : Hongyong Zhang It is certified that error appears in the above-identified patent and that said Letters Patent is hereby corrected as shown below:

Column 2, line 62, after β delete "B";

Column 6, line 26, replace "buffeted" with --buffered--;

Column 6, line 60, after "formed in" add --a--.

Signed and Sealed this
Fifth Day of April, 2011

David J. Kappos
*Director of the United States Patent and Trademark Office*